United States Patent
Ventzek et al.

(10) Patent No.: US 11,915,910 B2
(45) Date of Patent: Feb. 27, 2024

(54) FAST NEUTRAL GENERATION FOR PLASMA PROCESSING

(71) Applicant: Tokyo Electron Limited, Tokyo (JP)

(72) Inventors: Peter Ventzek, Austin, TX (US); Mitsunori Ohata, Miyagi (JP); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 175 days.

(21) Appl. No.: 17/212,038

(22) Filed: Mar. 25, 2021

(65) Prior Publication Data
US 2022/0310357 A1 Sep. 29, 2022

(51) Int. Cl.
H01J 37/32 (2006.01)

(52) U.S. Cl.
CPC .. H01J 37/32045 (2013.01); H01J 37/32174 (2013.01); H01J 37/32449 (2013.01); H01J 37/32715 (2013.01); H01J 2237/007 (2013.01); H01J 2237/334 (2013.01)

(58) Field of Classification Search
CPC .......... H01J 37/32045; H01J 37/32174; H01J 37/32449; H01L 21/31116; H01L 21/3065
See application file for complete search history.

(56) References Cited

U.S. PATENT DOCUMENTS

| | | |
|---|---|---|
| 2004/0195216 A1 | 10/2004 | Strang |
| 2006/0042752 A1 | 3/2006 | Rueger |

(Continued)

FOREIGN PATENT DOCUMENTS

| | | | |
|---|---|---|---|
| JP | 2006253190 A | * | 9/2006 |
| JP | 2017025407 A | | 2/2017 |
| WO | 2020185609 A1 | | 9/2020 |

OTHER PUBLICATIONS

Upadhyay, Rochan R, et al. "Experimentally Validated Computations of Simultaneous Ion and Fast Neutral Energy and Angular Distributions in a Capacitively Coupled Plasma Reactor." Journal of Physics D: Applied Physics, vol. 53, No. 43, 2020, p. 435209., doi:10.1088/1361-6463/aba068.

(Continued)

Primary Examiner — Binh X Tran
(74) Attorney, Agent, or Firm — Slater Matsil, LLP

(57) ABSTRACT

A method of plasma processing includes generating a glow phase of an electropositive plasma in a plasma processing chamber containing a first species, a second species, and a substrate comprising a major surface and generating an electronegative plasma in an afterglow phase of the electropositive plasma in the plasma processing chamber by combining the electrons of the electropositive plasma with atoms or molecules of the second species. The electropositive plasma includes positive ions of the first species and electrons. The electronegative plasma includes the positive ions and negative ions of the second species. The method further includes, in the afterglow phase, cyclically performing steps of generating neutral particles by applying a negative bias voltage at the substrate and applying a non-negative bias voltage at the substrate. The average velocity of the neutral particles is towards and substantially normal to the major surface of the substrate.

20 Claims, 9 Drawing Sheets

(56) References Cited

U.S. PATENT DOCUMENTS

2020/0058470 A1* 2/2020 Ventzek ............ H01J 37/32146
2022/0165546 A1* 5/2022 Lill .................. H01J 37/32082

OTHER PUBLICATIONS

Mizutani, Naoki, and Toshio Hayashi. "Charge Exchange Ion Energy Distribution at the RF Electrode in a Plasma Etching Chamber." Japanese Journal of Applied Physics, vol. 38, No. Part 1, No. 7A, 1999, pp. 4206-4212., doi:10.1143/jjap.38.4206.

Bromley, Steven, et al. "Charge Exchange Cross Sections for Noble Gas Ions and N2 between 0.2 and 5.0 KeV." Atoms, vol. 7, No. 4, 2019, p. 96., doi:10.3390/atoms7040096.

Massey, H S. "Collisions between Atoms and Molecules at Ordinary Temperatures." Reports on Progress in Physics, vol. 12, No. 1, 1949, pp. 248-269., doi:10.1088/0034-4885/12/1/311.

Vahedi, V., and M. Surendra. "A Monte Carlo Collision Model for the Particle-in-Cell Method: Applications to Argon and Oxygen Discharges." Computer Physics Communications, vol. 87, No. 1-2, May 16, 1994, pp. 179-198., doi:10.1016/0010-4655(94)00171-w.

Rapp, Donald, and W. E. Francis. "Charge Exchange between Gaseous Ions and Atoms." The Journal of Chemical Physics, vol. 37, No. 11, 1962, pp. 2631-2645., doi: 10.1063/1.1733066.

Franz, Gerhard. "Collisions and Cross Sections." Low Pressure Plasmas and Microstructuring Technology, 2009, pp. 5-40., doi:10.1007/978-3-540-85849-2_2.

Lindsay, B. G., and R. F. Stebbings. "Charge Transfer Cross Sections for Energetic Neutral Atom Data Analysis." Journal of Geophysical Research, vol. 110, No. A12, 2005, doi: 10.1029/2005ja011298.

Vasenkov, Alex V., et al. "Properties of c-C4F8 Inductively Coupled Plasmas. II. Plasma Chemistry and Reaction Mechanism for Modeling of Ar/c-C4F8/O2 Discharges." Journal of Vacuum Science & Technology A: Vacuum, Surfaces, and Films, vol. 22, No. 3, Apr. 27, 2004, p. 511., doi:10.1116/1.1697483.

International Searching Authority, "Notification of Transmittal of The International Search Report and The Written Opinion of The International Searching Authority,or The Declaration," International application No. PCT/US2022/021717, dated Jul. 15, 2022, 10 pages.

\* cited by examiner

FAST NEUTRAL GENERATION FOR PLASMA PROCESSING

TECHNICAL FIELD

The present invention relates generally to plasma processing, and, in particular embodiments, to methods, apparatuses, and systems for plasma processing that generate fast vertical neutrals at a substrate.

BACKGROUND

Device fabrication within microelectronic workpieces may involve a series of manufacturing techniques including formation, patterning, and removal of a number of layers of material on a substrate. There is a consistent and continuous push to improve the fabrication processes, features, and capabilities of microelectronics. These improvements may require new chemistry development as well as new advanced methods for process control.

Plasma processing is used in semiconductor device fabrication for many manufacturing techniques, such as deposition and etching. Pulsed plasma processing methods may utilize pulses of source power and/or bias power to control various parameters during plasma processing. For instance, radio frequency (RF) power or direct current (DC) power may be pulsed. RF power may also be combined with a DC offset, such as when applying bias pulses to an electrode. A negative DC self-bias voltage may build up over time on a powered electrode under certain circumstances, such as when using a blocking capacitor in an impedance matching network.

The plasma may include various species mixed together within the processing chamber. Additionally, each species within the plasma may generate a variety of plasma products such as ions, radicals, electrons, and dissociation products. The plasma products of each species may have different properties and be included for different purposes in the plasma. For example plasma products of different species may have different chemical properties such as differing reactivity relative to various materials of a substrate being processed or species within the plasma. Further, various species within the plasma may have different electronegativities and ionization energies resulting in differences in ion formation. Species may approach the surface in different ways. Charged particles may be accelerated through a sheath and be directed normal to the surface with increased verticality. These species are referred to as having an anisotropic angular distribution. In contrast, neutral species approach the surface with equal probability per unit solid angle. These are referred to as having an isotropic angular distribution.

Profile control may be important for high aspect ratio applications such as fabrication of memory and logic devices. Differential charging in high aspect ratio features may decrease ion verticality and reduce aspect ratio due to effects such as ion fanning. Additionally, the etch profile may be detrimentally affected by radical shading which can occur when slow (isotropic) neutral particles are shaded from the sides and bottoms of high aspect ratio features by the features themselves.

SUMMARY

In accordance with an embodiment of the invention, a method of plasma processing includes generating a glow phase of an electropositive plasma in a plasma processing chamber containing a first species, a second species, and a substrate comprising a major surface and generating an electronegative plasma in an afterglow phase of the electropositive plasma in the plasma processing chamber by combining the electrons of the electropositive plasma with atoms or molecules of the second species. The electropositive plasma includes positive ions of the first species and electrons. The electronegative plasma includes the positive ions and negative ions of the second species. The method further includes, in the afterglow phase, cyclically performing steps of generating neutral particles by applying a negative bias voltage at the substrate and applying a non-negative bias voltage at the substrate. The average velocity of the neutral particles is towards and substantially normal to the major surface of the substrate.

In accordance with another embodiment of the invention, a method of plasma processing includes flowing at least two gases into a plasma processing chamber comprising a radio frequency source power electrode, a radio frequency bias power electrode, and a substrate disposed between the radio frequency source electrode and the radio frequency bias electrode. The gases include a first species and a second species. The method further includes applying radio frequency source power to the gases to generate positive ions and electrons of the first species, removing the radio frequency source power from the gases to generate negative ions of the second species by combining electrons of the first species with atoms or molecules of the second species, and applying radio frequency bias power to the substrate, after a predetermined delay and after the removal of the radio frequency source power, to deliver neutral particles to the substrate. The radio frequency bias power includes a frequency less than about 10 MHz at the substrate.

In accordance with still another embodiment of the invention, a plasma processing apparatus includes a plasma processing chamber configured to contain an electronegative plasma comprising positive ions of a first species and negative ions of a second species, a source power supply coupled to the plasma processing chamber and configured to generate an electropositive plasma in the plasma processing chamber, a substrate including a major surface disposed in the plasma processing chamber, and a bias power generator circuit coupled between the substrate and a bias power supply. The bias power generator circuit is configured to apply a radio frequency bias voltage at the substrate. The electropositive plasma includes the positive ions of the first species and electrons that combine with the second species to form the negative ions. The radio frequency bias voltage alternates between a negative voltage and a non-negative voltage. The negative voltage generates neutral particles with velocity vectors pointing in the direction of and substantially normal to the major surface of the substrate.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
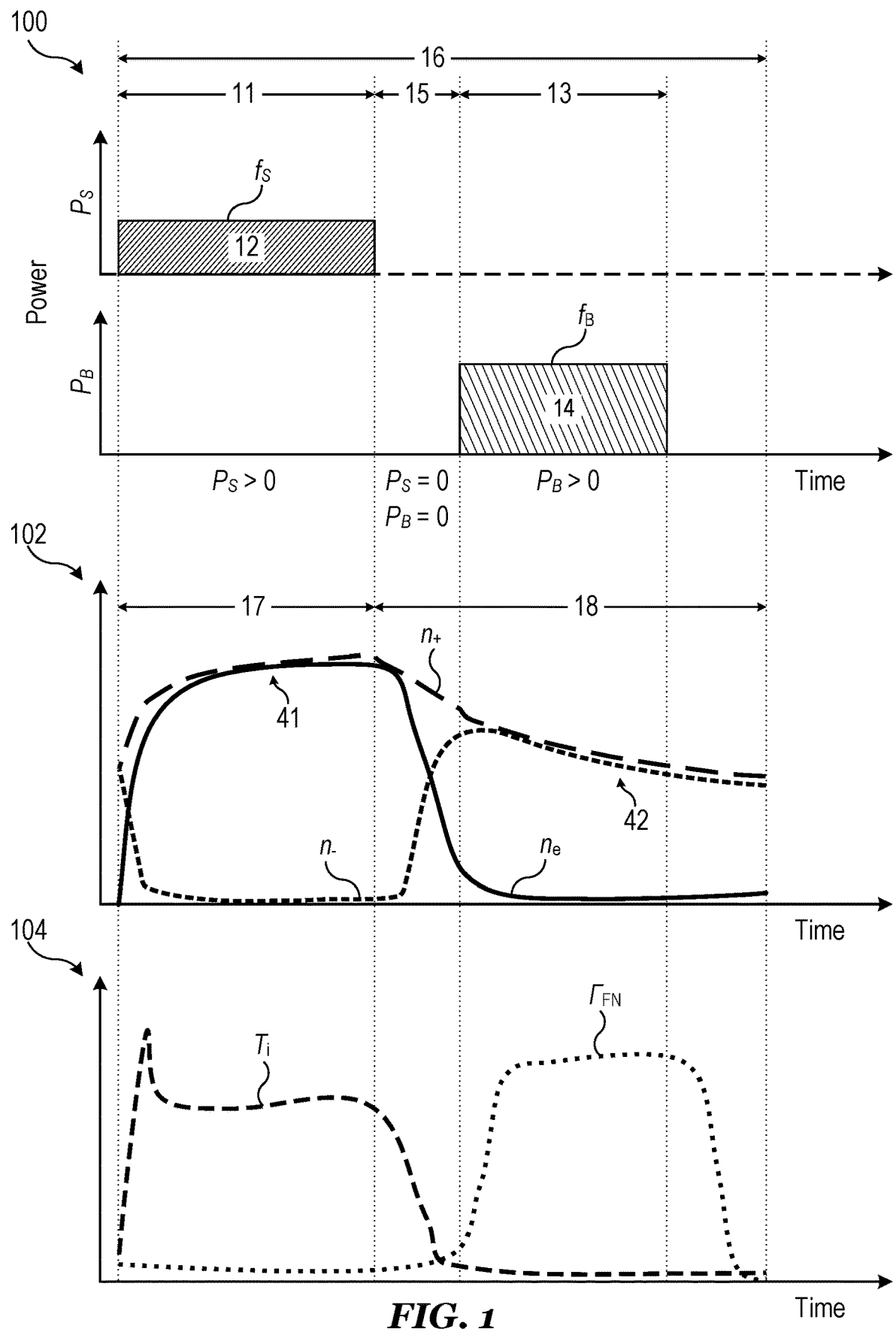
FIG. 1 illustrates a schematic timing diagram of an example plasma processing method and corresponding qualitative graphs in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Fast neutral particles may mitigate the undesirable effects of substrate charging and radical shading. For example, substrate charging may be mitigated by using neutral particles that do not impart charge to surfaces of the substrate. The effects of radical shading may be reduced by increasing the verticality of the neutral radicals. That is, background neutrals are slow (i.e. cold) and move in random directions whereas fast neutrals have a defined direction. For example, fast neutrals may be directed towards a substrate surface having an average velocity substantially perpendicular to the substrate surface (i.e. vertical). Fewer fast neutral particles are then shaded from reaching deep into features than slow background neutrals.

Neutral beams are one source of fast neutral particles. Neutral beams form from the extraction of ions from plasmas through an orifice through which the ions are neutralized. However neutral beams may be an impractical solution for various reasons such as high cost, increased complexity, and remote location relative to the substrate surface. Therefore, fast neutral particles generated from plasma near the substrate surface may be desirable.

The embodiment methods and plasma processing apparatuses described herein provide for the generation of fast neutral particles from an electronegative plasma that is contained in a plasma processing chamber. One specific example of an electronegative plasma is an "ion-ion" plasma which comprises similar densities of positive and negative ions but few (e.g. $<10^8$ $cm^{-3}$ or substantially zero) free electrons such that no sheath is formed. The fast neutral particles are generated at a surface of a substrate disposed in the plasma processing chamber by coupling a bias voltage to the substrate. Since there is little or no sheath, the applied electric field is sensed across the entire chamber. In various embodiments, the bias voltage is an RF bias voltage applied with a suitable frequency to the substrate as a bias power pulse. The bias voltage and resultant electric field accelerates ions in the electronegative plasma towards the substrate resulting in charge exchange collisions that generate the fast neutral particles. The fast neutral particles generated by the bias voltage have an average velocity towards and substantially normal to the surface.

Embodiment methods and plasma processing apparatuses may advantageously provide various benefits over conventional methods and apparatuses. For example, fast neutral particles may be advantageously generated from existing plasma in a plasma processing chamber that includes the substrate. Utilization of fast neutral particles may beneficially reduce substrate charging (e.g. ion fanning) during plasma processes. Further, fast neutral verticality may advantageously reduce radical shading during plasma processes. The reduction of substrate charging and/or radical shading can provide the desired advantage of improving feature profiles.

In various embodiments, the application of RF bias power may advantageously prevent sheath formation while generating fast neutral particles. The lack of significant sheath formation may prevent charge depletion beneficially allowing a substantially uniform electric field to be maintained across the bulk of the plasma. The RF bias power also may advantageously prevent substrate charging by limiting the duration of applied voltage in a single direction. For embodiments that do not generate a self-bias at the substrate, these benefits may be further enhanced. The application of RF bias power at a sufficiently low frequency may advantageously prevent electron heating.

The low electron density of the electronegative plasma in some embodiments may advantageously increase the time that ions can be accelerated without significant sheath formation. Consequently, the low electron density may advantageously increase the flux of fast neutral particles to the substrate. For example, multiple charge exchange collisions between fast ions and background neutral particles may occur from the same initial ion due to increased duration of the applied bias voltage.

The lack of a significant sheath causes a greater volume of plasma to experience an electric field which may advantageously result in more charge exchange collisions. Therefore, the greater volume experiencing the electric field and the increased duration of each application of bias voltage may advantageously increase the opportunity for fast neutral generation and thereby increase fast neutral flux at the substrate.

The fast neutral flux may be advantageously coupled to various controllable parameters such as RF bias frequency, bias power, plasma density, and the like. In this way, an advantage of the embodiment methods described herein may be to enable fast neutral flux control using the various controllable parameters. The fast neutral flux may also be advantageously tunable relative to other metrics of interest such as ion flux.

Figure 8:
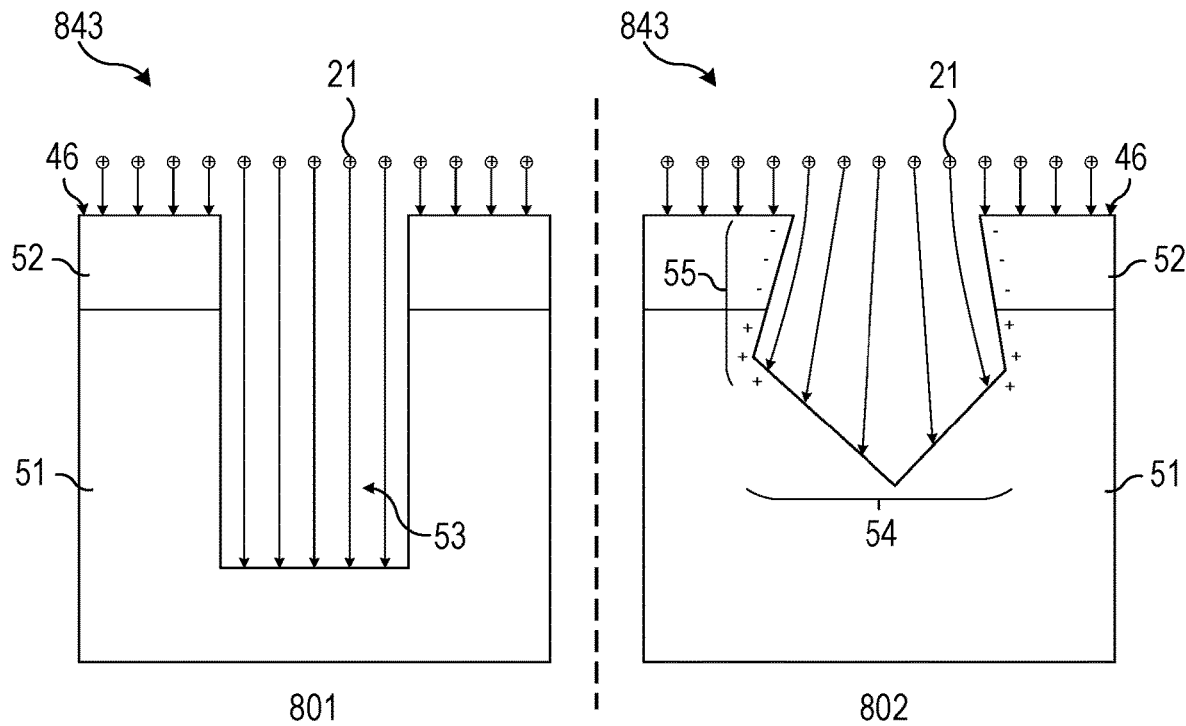
FIG. 8 illustrates a cross-sectional view of an example substrate during a plasma etching process with and without differential charging in accordance with an embodiment of the invention.
Figure 9:
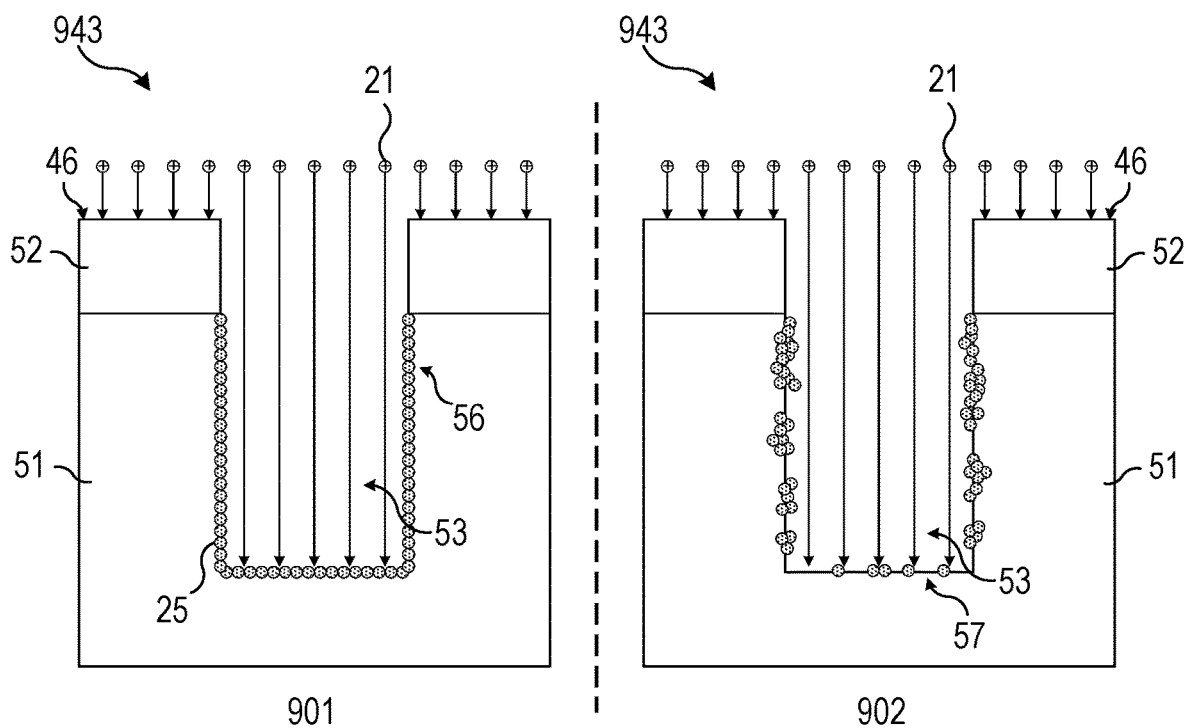
FIG. 9 illustrates a cross-sectional view of an example substrate during a plasma etching process with and without radical shading in accordance with an embodiment of the invention.

Embodiments provided below describe various methods, apparatuses, and systems for plasma processing, and in particular, methods, apparatuses, and systems for plasma processing in which fast neutral particles directed towards and substantially normal to a substrate surface are generated from an electronegative plasma. The following description describes the embodiments. An example schematic timing diagram of an embodiment plasma processing method is described using FIG. 1. Several embodiment charge exchange collisions resulting in fast neutrals are described using FIGS. 2-4. FIG. 5 is used to describe an embodiment plasma processing system including an electronegative plasma disposed between an upper electrode and a lower electrode. Two example qualitative graphs corresponding with embodiment plasma processing methods are described using FIGS. 6 and 7 while FIGS. 8 and 9 are used to describe embodiment etching processes with and without two example undesirable scenarios. An embodiment plasma processing apparatus is described using FIG. 10. Two embodiment methods of plasma processing are described using FIGS. 11 and 12.

FIG. 1 illustrates a schematic timing diagram of an example plasma processing method and corresponding qualitative graphs in accordance with an embodiment of the invention.

Referring to FIG. 1, a schematic timing diagram 100 shows the timing of a pulse sequence that includes at least one source power pulse 12 with source power duration 11 and at least one bias power pulse 14 with bias power duration 13. The source power pulse 12 has a source power $P_S$ while the bias power pulse 14 has a bias power $P_B$. In various embodiments, the source power pulse 12 is an RF source power pulse applied with source power frequency $f_S$. The source power frequency $f_S$ may be any suitable frequency, but is a high frequency (HF) RF in various embodiments. In one embodiment, the source power frequency $f_S$ is about 13.56 MHz. Similarly, in some embodiments, the bias power pulse 14 is an RF bias power pulse applied with bias power frequency $f_B$. The bias power frequency $f_B$ may be lower than the source power frequency $f_S$.

The bias power pulse 14 may optionally be temporally separated from the source power pulse 12 by a delay duration 15 as shown. During the delay duration 15 no source power is applied. In the same way, no bias power is applied during the delay duration 15 in various embodiments.

The pulse sequence may be repeatedly applied with each cycle 16 including at least one source power pulse and at least one bias power pulse. During the application of each source power pulse 12, $P_S$ is greater than zero. In some embodiments, $P_B$ is zero during the source power pulse 12. Alternatively, some bias power ($P_B>0$) may be applied during the source power pulse 12. Similarly, during the bias power pulse 14, $P_B>0$ while $P_S$ is low or zero. The application of no source power during the bias power pulse 14 may advantageously prevent electron generation and maintain low plasma temperatures.

The qualitative graph 102 corresponds to the schematic timing diagram 100 and shows the qualitative behavior of positive ion density $n_+$, negative ion density $n_-$, and electron density $n_e$ within a plasma processing system. The source power pulse 12 generates a plasma (e.g. in a plasma processing chamber) during the source power duration 11. While the source power is applied, a glow phase 17 of the plasma is maintained in which the plasma is an electropositive plasma 41. The plasma may be an ion-electron plasma having appreciable densities of both positive ions and free electrons as shown by the elevated values of $n_+$ and $n_e$. That is, although there may be some negative ions (e.g., even up to 90%) in the ion-electron plasma, there is still a sheath due to a substantial electron density. The number of negative ions in the ion-electron plasma depends on the chemistry of the specific implementation.

After the source power is removed at the end of the source power pulse 12, an afterglow phase 18 of the plasma begins as $n_+$ and $n_e$ decrease due to recombination. The electron density $n_e$ drops at a faster rate than $n_+$ due to the increased mobility of the electrons and as well as combination of the electrons with other available electronegative neutrals to form negative ions. Consequently, during the delay duration 15 (i.e. when little or no power is being applied to the system), the negative ion density $n_-$ rises sharply while charge neutrality of the plasma is maintained. An electronegative plasma 42 (which becomes an ion-ion plasma as $n_e$ approaches zero) is formed in the afterglow phase 18. The electronegative plasma 42 includes both positive ions and negative ions, but relatively few or no free electrons.

The terms electropositive plasma and electronegative plasma may be considered broader terms than ion-electron plasma and ion-ion plasma respectively. For example, electronegative and electropositive may be used to describe the propensity for the electron density of a plasma to increase or decrease within the plasma. Thus, after an appropriate period of time, a net electropositive plasma may naturally have a meaningful number of free electrons (ion-electron plasma) while a net electronegative plasma may generate a sufficient quantity of negative ions to result in an ion-ion plasma.

The electronegativity of a plasma may be related to the presence of electropositive and electronegative species. For instance, a net electropositive plasma or net electronegative plasma may simultaneously include both an electropositive plasma (e.g. Ar, etc.) and an electronegative plasma (e.g. Cl, O, etc.). The balance between aggregate electropositivity and electronegativity may depend on outside conditions such as relative densities of species within the plasma, pressure, applied power and bias, and others.

In this way, the delay duration 15 may be appropriately leveraged to generate the electronegative plasma 42 in the afterglow phase 18 of the electropositive plasma 41. In various embodiments, the delay duration is on the order ion-electron relaxation time $\tau_+$ of a given electropositive plasma which may advantageously enable application of bias power when both positive and negative ion densities are high and the electron density is low (electronegative plasma). In some embodiments, the delay duration 15 is less than about 5 μs. In one embodiment, the delay duration 15 is about 10 μs. In another embodiment, the delay duration is about 50 μs.

As shown in the qualitative graph 104 (also corresponding to the schematic timing diagram 100), the ion temperature $T_i$ spikes and then maintains an elevated state during the application of the source power pulse 12 in the glow phase 17. After the source power is removed, $T_i$ drops off along with $n_e$. At such point that the electronegative plasma 42 has sufficiently formed and before a large number of positive ions and negative ions neutralize one another, the bias power pulse 14 is applied. The applied bias power during the bias power duration 13 generates a fast neutral flux $\Gamma_{FN}$ without substantially increasing $T_i$ and $n_e$ while $n_+$ and $n_-$ fall off slowly.

The electronegative plasma 42 may advantageously decrease the rate of sheath formation due to the low electron density $n_e$ in the afterglow phase 18. That is, the timescale for sheath formation may be dominated by the very large ion mass (relative to the low mass of electrons) and the low ion temperature. Under these conditions, the ions are both heavy and cold so the recombination time is increased compared to plasmas that include high electron densities. This lengthened relaxation time may be sufficient to accelerate ions in the direction of the substrate with minimal sheath formation beneficially resulting in favorable conditions for charge exchange collisions within the electronegative plasma 42.

The bias power frequency $f_B$ may be directly affected by the relaxation time. For example, lower bias power frequencies become viable as the relaxation time is increased (sheath formation can be avoided for longer periods of time). Higher bias power frequency $f_B$ may also cause undesirable electron heating. Therefore, a possible advantage of the use of the electronegative plasma 42 to enable lower $f_B$ is to reduce or prevent secondary emission due to elevated electron temperature.

The low ion temperature $T_i$ combined with the lengthened applications of bias voltage (from reducing $f_B$) may advantageously result in highly directional ions during the bias power pulse 14. These highly directional ions interact with background neutral particles (e.g. radicals) in charge exchange collisions within the electronegative plasma 42. The charge exchange collisions generate fast neutral particles with substantially similar velocity as the directional ions. That is, the fast neutral particles may advantageously have an average velocity towards and substantially normal to a major surface of the substrate to which the bias power is applied.

The generation of fast neutral particles from the electronegative plasma 42 may enable utilization of fast neutrals to combat undesirable effects such as substrate charging and radical shading without the downsides of conventional neutral beams. For example, the schematic timing diagram 100 may be used to generate fast neutral particles from an existing plasma in close proximity to the surface of a substrate. In contrast, conventional neutral beam sources may be impractical due to high cost, incompatibility with existing systems, and remote location of the neutral beam source (e.g., orifice plate) relative to the substrate.

The bias power duration 13 may be relatively short. For example, the plasma may become more resistive over time, the plasma density will continue to decrease, and the fast neutral flux $\Gamma_{FN}$ will decrease over time. In one embodiment, the bias power duration 13 is less than about 50 μs. The source power duration 11 may also be kept as short as possible since the plasma density may quickly level off and purpose of the source power pulse 12 is only to generate the positive ions and electrons for later use. The cycle 16 of the pulse sequence may consequently be relatively short. For example, the cycle 16 may be less than about 200 μs.

Figure 2:
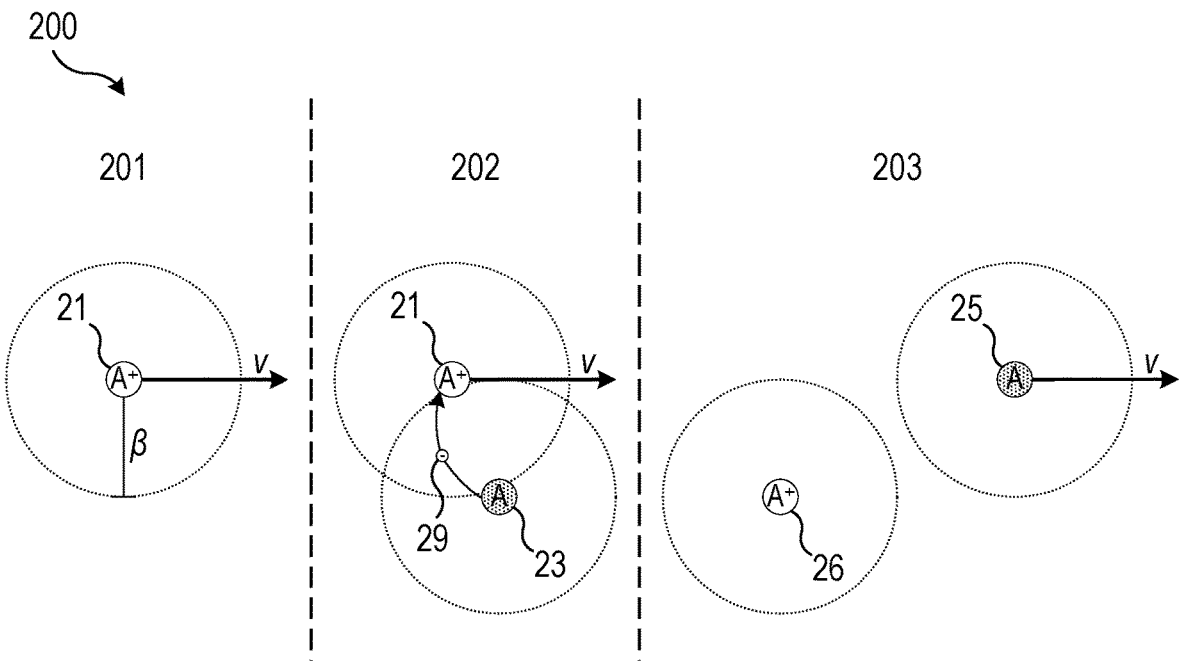
FIG. 2 illustrates a schematic diagram of an example charge exchange collision between a positively charged first species ion and a background first species neutral resulting in a fast first species neutral in accordance with an embodiment of the invention.

FIG. 2 illustrates a schematic diagram of an example charge exchange collision between a positively charged first species ion and a background first species neutral resulting in a fast first species neutral in accordance with an embodiment of the invention. The charge exchange collision of FIG. 2 may be generated during plasma processing methods described herein, such as the plasma processing method of FIG. 1, for example. Similarly labeled elements may be as previously described.

Referring to FIG. 2, a charge exchange collision 200 includes a positively charged first species ion 21 ($A^+$) and a background first species neutral 23 (A). At a first instant 201 before $A^+$ and A are near enough to one another to interact, $A^+$ has a velocity υ in the direction of A in the reference frame of A (where A is motionless). This is also a fair approximation of the reference frame of the system since A is a neutral particle in the plasma background with low temperature (low velocity).

During the first instant 201, $A^+$ moves with velocity υ towards A. A quantity called an impact parameter β defines a distance over which $A^+$ and A sense one another (e.g. are close enough to interact). The charge exchange collision 200 depicted in FIG. 2 is symmetric because both $A^+$ and A are some first species that differ from each other only by an electron. Therefore, the charge exchange collision 200 is a symmetric positive ion charge exchange collision.

At a second instant 202, $A^+$ and A are close enough to interact and an electron 29 is exchanged. Specifically, the electron 29 is transferred from A to $A^+$. The result is that at a third instant 203, a slow positively charge first species ion 26 ($A^+$) and a fast first species neutral 25 (A) with velocity υ are generated. The interaction equation of the charge exchange collision 200 can then be written as $A_{fast}^+ + A_{slow} \rightarrow A_{fast} + A_{slow}^+$.

The overall effect of the charge exchange collision 200 is to "change" the identity of the fast particle from a positive ion to a neutral particle. Advantageously, the fast first species neutral 25 maintains velocity υ because the charge exchange collision 200 is a forward scattering collision with negligible momentum transfer. Collisions such as the charge exchange collision 200 may be generated in a plasma by accelerating positive ions in a plasma to velocity υ using an applied bias voltage, such as during the bias power pulse 14 of FIG. 1, for example.

The probability of charge exchange collision events are directly related to the density of particles and the impact parameter β and are indirectly proportional to the relative velocity v between ions and neutrals. Therefore, lower relative velocities υ will result in larger numbers of generated fast neutral particles (due to increased collision probability) but the fast neutral particles will have lower velocity. In this way, a trade-off may exist between the fast neutral energy and the fast neutral flux.

Figure 3:
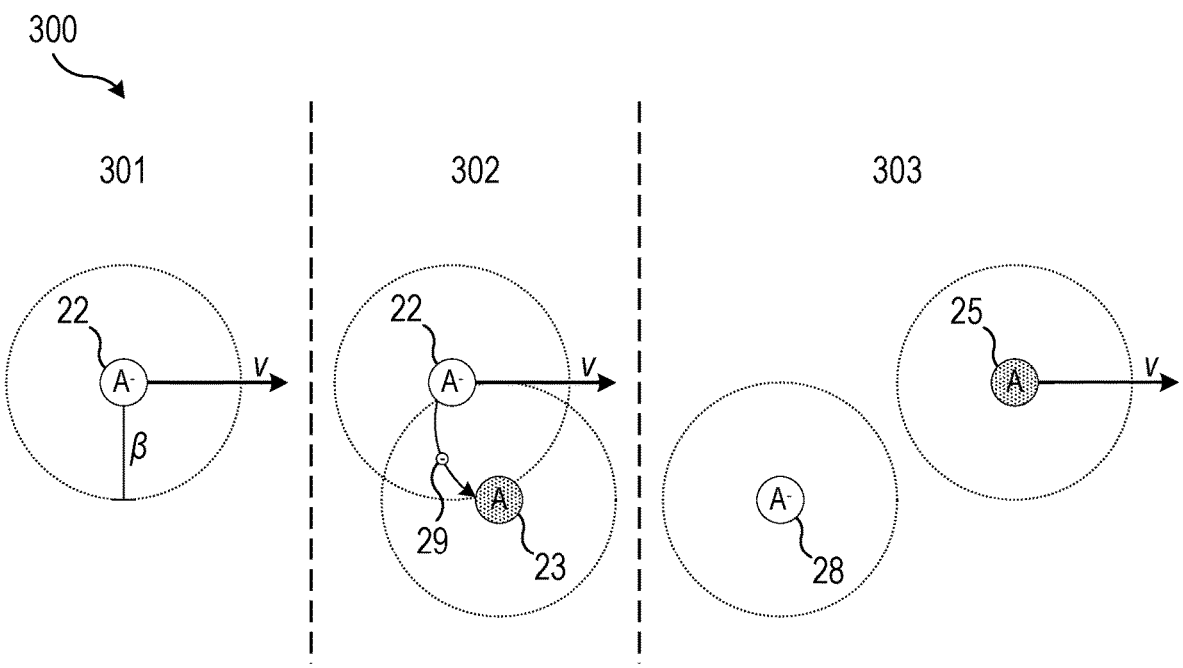
FIG. 3 illustrates a schematic diagram of an example charge exchange collision between a negatively charged first species ion and a background first species neutral resulting in a fast first species neutral in accordance with an embodiment of the invention.

FIG. 3 illustrates a schematic diagram of an example charge exchange collision between a negatively charged first species ion and a background first species neutral resulting in a fast first species neutral in accordance with an embodiment of the invention. The charge exchange collision of FIG. 3 may be generated during plasma processing methods described herein, such as the plasma processing method of FIG. 1, for example. Similarly labeled elements may be as previously described.

Referring to FIG. 3, a charge exchange collision 300 includes a negatively charged first species ion 22 (A⁻) and a background first species neutral 23 (A). In analogy to the charge exchange collision 200 of FIG. 2, A⁻ has a velocity $\upsilon$ at a first instant 301 relative to A and an impact parameter β. At a second instant 302, an electron 29 is transferred from A⁻ to A resulting, at a third instant 303, in a slow negatively charged first species ion 28 (A⁻) and a fast first species neutral 25 with velocity $\upsilon$. Thus, the interaction equation of the charge exchange collision 300 can be written as $A_{fast}^- + A_{slow} \rightarrow A_{fast} + A_{slow}^-$.

Similar to the charge exchange collision 200 of FIG. 2, the collision is symmetric and the charge exchange collision 300 is a symmetric negative ion charge exchange collision. The overall effect of the charge exchange collision 300 is to "change" the identity of the fast particle from a negative ion to a neutral particle. Collisions such as the charge exchange collision 300 may be generated in a plasma by accelerating negative ions in a plasma to velocity $\upsilon$ using an applied bias voltage, such as during the bias power pulse 14 of FIG. 1, for example.

Figure 4:
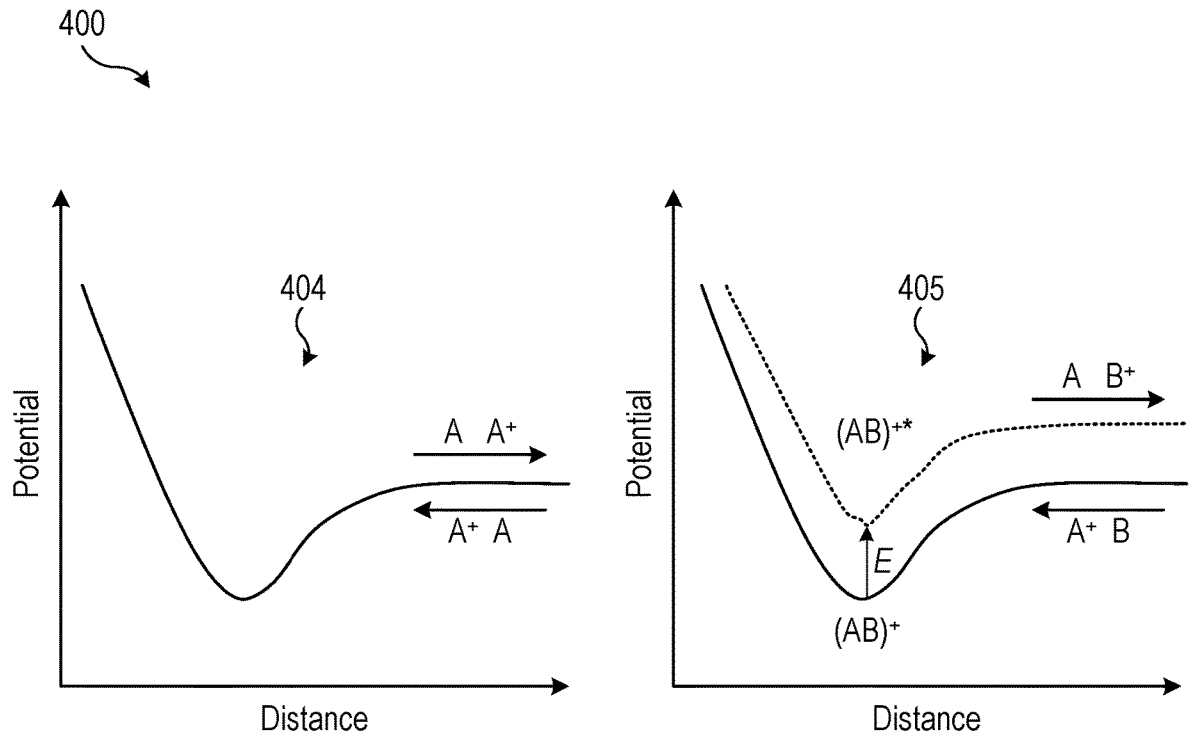
FIG. 4 illustrates a schematic diagram of an example charge exchange collision between a first species ion and a background second species neutral resulting in a fast first species neutral in accordance with an embodiment of the invention.
Figure 4:
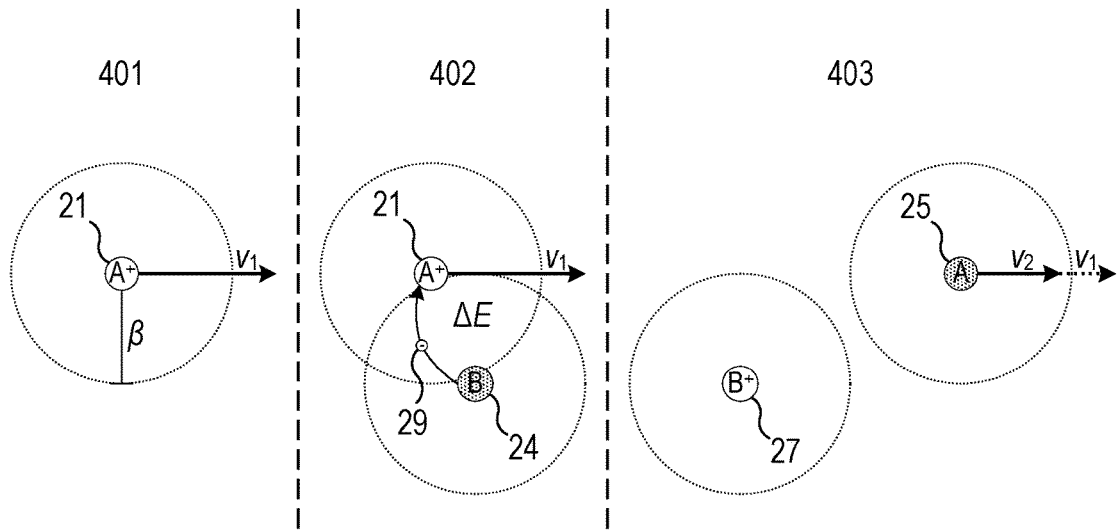
Figure 5:
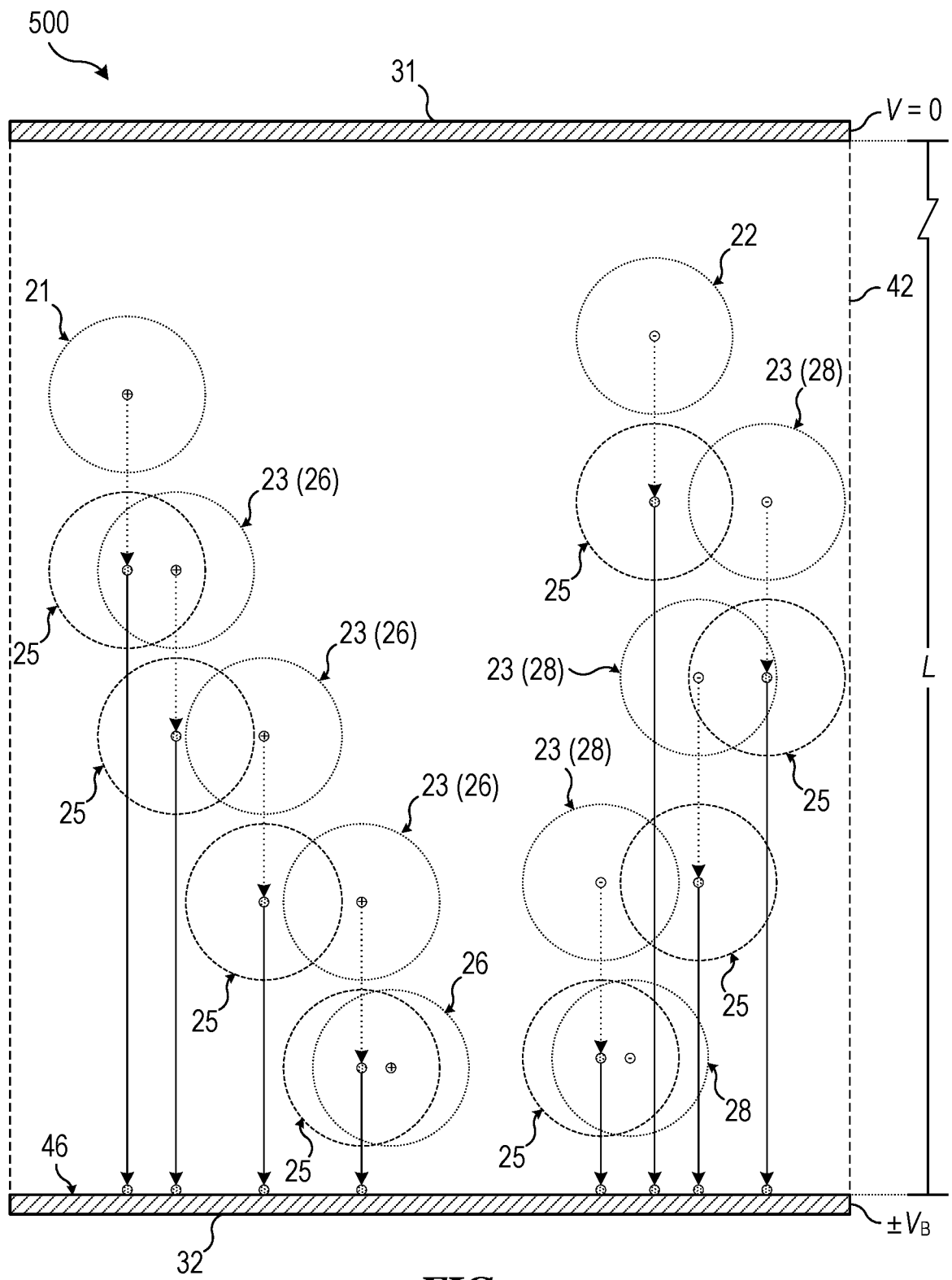
FIG. 5 illustrates a schematic diagram of an example plasma processing system including an electronegative plasma disposed between an upper electrode and a lower electrode where an applied voltage at the lower electrode creates a cascade of fast neutrals with average velocity towards and substantially normal to a major surface of the lower electrode in accordance with an embodiment of the invention.

FIG. 4 illustrates a schematic diagram of an example charge exchange collision between a first species ion and a background second species neutral resulting in a fast first species neutral in accordance with an embodiment of the invention. The charge exchange collision of FIG. 4 may be generated during plasma processing methods described herein, such as the plasma processing method of FIG. 1, for example. Similarly labeled elements may be as previously described.

Referring to FIG. 4, a charge exchange collision 400 may include a positively charged first species ion 21 (A⁺) and a background second species neutral 24 (B). In contrast to the previously described charge exchange collisions, the charged particle A⁺ is not the same species (e.g., atom, molecule, complex) as the neutral particle B. As a result, the charge exchange collision 400 is an asymmetric charge exchange collision.

At a first instant 401, A⁺ has a first velocity $\upsilon_1$ relative to B and an impact parameter β. At a second instant 402, an electron 29 is transferred from B to A⁺ resulting, at a third instant 403, in a slow positively charged second species ion 27 (B⁺) and a fast first species neutral 25 with a second velocity $\upsilon_2$. However, due to the asymmetry between the first species and the second species, some change in energy ΔE is required to facilitate the transfer of charge from B to A⁺.

For instance, in a symmetric charge exchange interaction, the initial state and the final state has the same energy. In other words, as shown in the symmetric interaction diagram 404 which shows potential energy versus interatomic separation, no additional energy is required to obtain the result of A+A⁺ rather than A⁺+A. In contrast, for an asymmetric charge exchange interaction, the final state of A+B⁺ (i.e. the state where charge transfer took place) has a higher energy than the initial state of A⁺+B as illustrated in asymmetric interaction diagram 405.

The interaction potential of the system A⁺+B is qualitatively depicted by the solid (bottom) line where the distance between A⁺ and B is decreasing as the solid line is traversed from right to left. At some point along the potential curve (here a minimum), the system is in a transient interaction state where the excess positive charge is shared between A and B and is shown as (AB)⁺. Additional energy E is needed to excite (AB)⁺ to a higher energy state (AB)⁺* from which the desired final state of A+B⁺ may be obtained, which is depicted by the dashed (top) line. Therefore, the interaction equation for the charge exchange collision 400 (an asymmetric positive ion charge exchange collision) can be written as A⁺+B→A+B⁺+ΔE.

The additional energy that makes charge transfer possible for the asymmetric charge exchange collision may come from any suitable source. For example, as shown, the additional energy E may come from the velocity $\upsilon_1$ of A⁺. In this case, although the direction is maintained after the collision, the velocity $\upsilon_2$ of the resulting fast neutral A is smaller than $\upsilon_1$. Alternatively, some or all of the energy may come from other sources such as radiant energy (e.g. light emission from the plasma) and $\upsilon_2$ will be equal to or very close to $\upsilon_1$.

It should be noted, that in an electronegative plasma such as previously described in reference to FIG. 1, there may be little available energy other than imparted ion velocity due to low ion temperature $T_i$ and low electron temperature $T_e$. Therefore, slower ions (smaller $\upsilon_1$) may be less likely to transition to the excited state and thereby may be more likely to relax back to the initial state resulting in the original fast ion and slow neutral. Of course, more complicated charge exchange collisions involving association and dissociation are also possible and may also be utilized to generate fast neutral particles from accelerated ions within a plasma.

FIG. 5 illustrates a schematic diagram of an example plasma processing system including an electronegative plasma disposed between an upper electrode and a lower electrode where an applied voltage at the lower electrode creates a cascade of fast neutrals with average velocity towards and substantially normal to a major surface of the lower electrode in accordance with an embodiment of the invention. The plasma processing system of FIG. 5 may be used to perform plasma processing methods as described herein, such as the plasma processing method of FIG. 1, for example. Similarly labeled elements may be as previously described.

Referring to FIG. 5, a plasma system 500 includes an electronegative plasma 42 formed between an upper electrode 31 and a lower electrode 32. The upper electrode 31 is separated from the lower electrode 32 by a distance L. In various embodiments, the distance L is on the order of tens of centimeters and is less than about 15 cm in some embodiments. In one embodiment, the distance L is about 15 cm. The electronegative plasma 42 includes positive ions 21 and negative ions 22. The electronegative plasma 42 also includes background neutral particles and may include other positive, negative, and neutral particles.

The upper electrode 31 is held at a reference potential (V=0). For example, the upper electrode 31 may be coupled to a ground potential. A bias voltage (±$V_B$) is generated at the lower electrode 32. For example, the bias voltage may be generated by applying bias power to the lower electrode 32 using a bias power pulse, such as previously described in reference to FIG. 1.

When the bias voltage is negative (–$V_B$) with respect to the reference voltage of the upper electrode 31, positive ions are accelerated in the generated electric field between the electrodes. The positive ions participate in charge exchange collisions with background neutral particles thereby generating fast neutral particles with average velocity towards and substantially perpendicular to a surface of the lower electrode 32.

The charge exchange collisions may be symmetric or asymmetric and each positive ion may participate in multiple charge exchange collisions. For example, as shown, a positive ion 21 may be accelerated toward the lower electrode 32 and collide with a background neutral 23 resulting in a fast neutral particle 25 and a slow positive ion 26. As long as the lower electrode 32 is still at a negative voltage, the new slow positive ion 26 is also accelerated and may collide with another background neutral 23 generating another fast neutral particle 25 and slow positive ion 26.

In this way a cascade of charge exchange collisions may generate multiple fast neutral particles 25 with velocity perpendicular to the surface of the lower electrode 32 (and, e.g., to the surface of a substrate disposed on the lower electrode 32). The embodiments described herein may have the advantage of generating multiple collisions per ion because sheath formation is minimal during the application of bias power to the electronegative plasma 42. A negligible sheath may also advantageously increase the distance over which the plasma experiences the electric field. This carries the benefit of accelerating more ions and generating more charge exchange collisions which increases the opportunity for fast neutral generation.

The resulting fast neutral particles 25 are unaffected by changes in voltage at the lower electrode 32. That is, when the bias voltage is applied using an RF bias power pulse that oscillates between a negative voltage and a non-negative voltage, the fast neutral particles 25 maintain their trajectory towards the lower electrode 32. A possible advantage of this is that fast neutral particles 25 generated in the interior of the electronegative plasma 42 will still reach the lower electrode 32.

Similarly, in embodiments where the bias voltage becomes positive at the lower electrode (+$V_B$), a negative ion 22 may be accelerated toward the lower electrode 32 and collide with a background neutral 23 resulting in a fast neutral particle 25 and a slow negative ion 28. The slow negative ion 28 may then participate in a cascade of charge exchange collisions with background neutrals 23 while the lower electrode 32 is at a positive voltage.

The application of RF bias power to the lower electrode may advantageously generate fast neutral particles without charging the lower electrode 32 because the charged particles move back and forth with the frequency $f_B$ while the fast neutrals are unaffected by the electric field oscillations. This may further provide the advantage of delivering a high fast neutral flux $\Gamma_{FN}$ at the substrate relative to the ion flux $\Gamma_i$.

In particular, $\Gamma_{FN}$ is greater than $\Gamma_i$ at the substrate in some embodiments. In various embodiments, the ratio of $\Gamma_{FN}$:$\Gamma_i$ is greater than about 2:1. The ratio of $\Gamma_{FN}$:$\Gamma_i$ may be related to pressure, sheath thickness, and bias voltage, among other variables. In one scenario (e.g. a higher pressure regime) the ratio $\Gamma_{FN}$:$\Gamma_i$ may about 10:1. For example, in the case of 100 mTorr pressure, 5 mm sheath thickness, and 1 kV bias voltage a ratio of 10:1 may be achievable although other variables may also affect the ratio. Additionally, because sheath thickness is a function of bias voltage and electron density the ratio of $\Gamma_{FN}$:$\Gamma_i$ may be lower for lower pressures, such as 20 mTorr.

The voltage at the lower electrode 32 may oscillate around the reference voltage (V=0). That is, the voltage may repeatedly cycle from +$V_B$ to −$V_B$ and charged particles within the electronegative plasma 42 may remain relatively stationary. Consequently, the benefits of applying RF bias power may be further enhanced by avoiding self-bias at the lower electrode 32. In some embodiments, substantially no self-bias is generated at the lower electrode 32 during application of the RF bias power. This may be due, for example, to some combination of alternating positive and negative voltage the electrode and the balanced current of an ion-ion plasma. That is, positive ions may be injected during one portion of a cycle while negative ions are injected in the remaining portion of the cycle to reduce or eliminate differential charging at a substrate surface, differential charging being a major contributor to self-bias generation.

Figure 6:
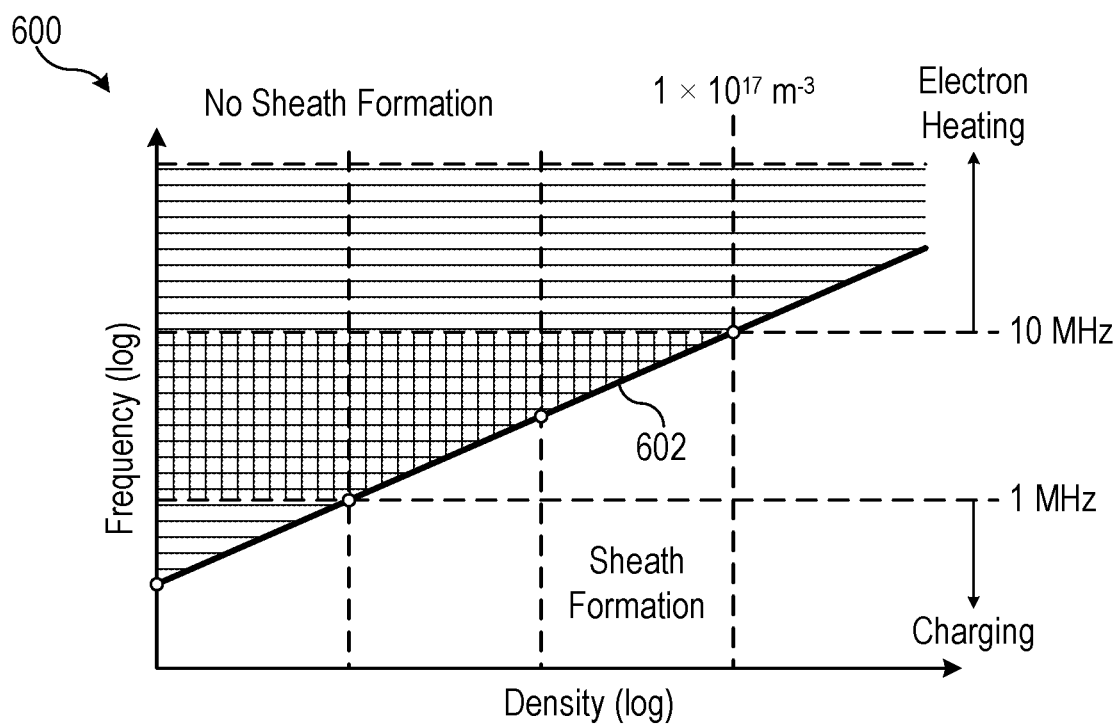
FIG. 6 illustrates a qualitative graph of bias voltage frequency versus plasma density showing regimes for sheath formation, electron heating, and charging in accordance with an embodiment of the invention.

FIG. 6 illustrates a qualitative graph of bias voltage frequency versus plasma density showing regimes for sheath formation, electron heating, and charging in accordance with an embodiment of the invention. The qualitative graph of FIG. 6 may correspond with conditions during plasma processing methods as described herein, such as the plasma processing method of FIG. 1, for example. Similarly labeled elements may be as previously described.

Referring to FIG. 6, a qualitative graph 600 of shows bias power frequency $f_B$ versus plasma density n on a log-log axis. In order to prevent sheath formation, the sheath formation time $\tau_-$ should be greater than the period of the applied RF bias power (1/$f_B$). The sheath formation time $\tau_-$ is related to the plasma density n and the ion drift velocity υ by the equation $$\tau_- = \frac{1}{v\sqrt{n}}\left(\frac{\varepsilon_0 \Phi}{e}\right)^{\frac{1}{2}}$$

where $\varepsilon_0$ is the permittivity of free space, e is the elementary charge, and $\Phi$ is the sheath potential.

While no sheath has formed, largescale charge exchange is possible in the electronegative plasma due to the approximately linear potential drop between the electrodes (constant electric field experienced by the electronegative plasma). Then, the following condition can be used to indicate when a given electronegative plasma system is in a charge exchange regime:

$$\frac{1}{v\sqrt{n}}\left(\frac{\varepsilon_0 \Phi}{e}\right)^{\frac{1}{2}} > \frac{1}{f_B}$$

A representative time for sheath formation (here defined, for example, as 10 V of sheath potential) in an electronegative plasma with density n of $2\times10^{16}$ m$^{-3}$ and ion drift velocity υ of 1000 m/s is $\tau_-$=150 ns. The qualitative graph 600 illustrates these two regimes with the dividing line 601 representing the inequality condition given above.

The range of available frequency is extended to lower frequencies for lower density plasmas. However, fast neutral flux $\Gamma_{FN}$ is directly proportional to the plasma density so a balance between density and frequency may be desirable to achieve a given flux. The plasma density may be controlled using, for example, source power while the bias frequency $f_B$ may be controlled directly.

To additional undesirable effects are also illustrated in the qualitative graph 600. These are electron heating, which may occur in significant extent for bias frequencies above about 10 MHz as shown. Additionally, substrate charging may become an issue for sufficiently low frequencies (e.g. less than about 1 MHz) as electrons and ions reach the substrate rather than remaining in the plasma. Consequently, an ideal range may exist where the bias frequency $f_B$ is between about 1 MHz and about 10 MHz and the plasma density n is below about $1\times10^{17}$ m$^{-3}$ as shown.

The above condition was determined assuming that the electron density $n_e$ is negligible in the electronegative plasma. Any increase in electron density $n_e$ will result in faster sheath formation. Therefore, low electron density $n_e$ during applied bias power increases the amount of time that ions may be accelerated thereby potentially increasing both the fast neutral flux and the average velocity of the fast neutral particles.

It should be noted that ion velocity $\upsilon$ is also present in the above condition. As $\upsilon$ increases, the $\tau_-$ decreases pushing the bias frequency $f_B$ to avoid sheath formation higher. Bias power may be used to control the ion velocity $\upsilon$. Therefore, lower bias power may be desirable to allow frequencies within the ideal of range of about 1 MHz to 10 MHz to be used. In various embodiments, the bias power $P_B$ peak voltage is less than about 500 V. In one embodiment, the bias power $P_B$ peak voltage is about 400 V. In another embodiment, the bias power $P_B$ peak voltage is about 100 V.

Figure 7:
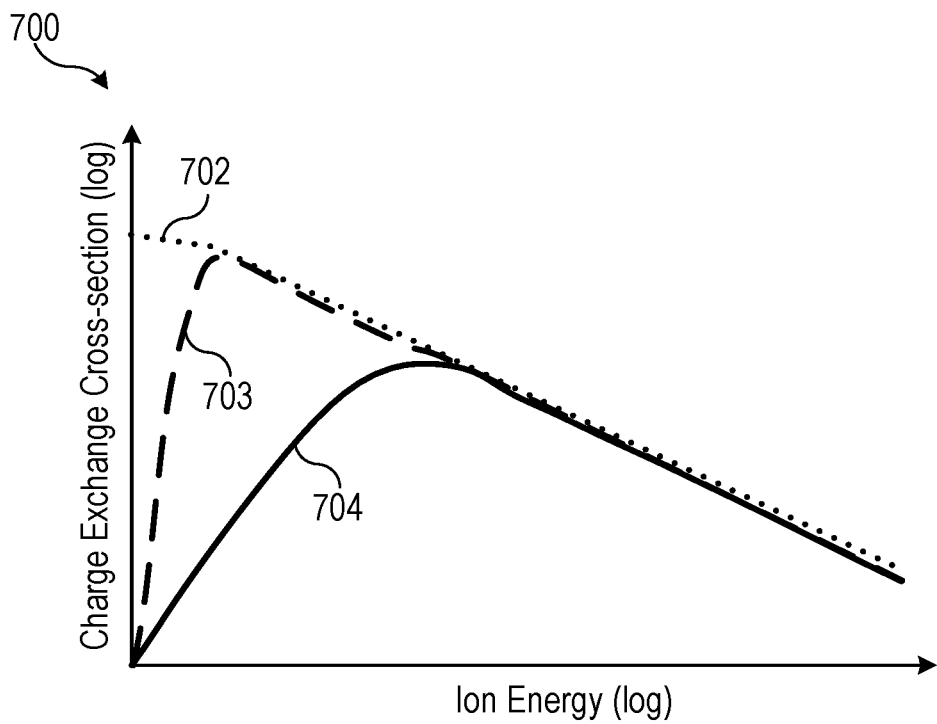
FIG. 7 illustrates a qualitative graph of charge exchange cross-section versus ion energy for symmetric and asymmetric charge exchange interactions in accordance with an embodiment of the invention.

FIG. 7 illustrates a qualitative graph of charge exchange cross-section versus ion energy for symmetric and asymmetric charge exchange interactions in accordance with an embodiment of the invention. The qualitative graph of FIG. 7 may correspond with conditions during plasma processing methods as described herein, such as the plasma processing method of FIG. 1, for example. Similarly labeled elements may be as previously described.

Referring to FIG. 7, a qualitative graph 700 shows the charge exchange cross-section versus ion energy on a log-log axis for a symmetric collision 702, an approximately symmetric collision 703, and an asymmetric collision 704. Generally, when no energy is required for charge transfer to occur (as in the symmetric collision 702), the charge exchange cross-section increases as ion energy is reduced as shown. For the approximately symmetric collision 703, only the slowest ions are unable to transfer charge which results in a sharp increase in the charge exchange cross-section from zero to the fully symmetric curve.

In contrast, in the asymmetric collision 704, higher velocity is needed to facilitate charge transfer resulting in a defined peak in the ion energy at velocity values significantly higher than zero. Therefore, although the bias power (imparting velocity to the ions) is desirably kept low for the reasons given above, a practical lower bound for the bias power may exist in implementations that where fast neutral generation through asymmetric charge exchange collisions is desired.

Each different possible charge exchange collision reaction has a given rate coefficient due to differences in the properties of the two species (such as differences in electronegativity, ionization potential, mass, etc.) The asymmetric charge exchange collision reactions can be divided in two groups: exothermic reactions (occurring without additional ion energy) and endothermic reactions (typically requiring a few eV for charge transfer to occur). The endothermic reactions may be divided into two subgroups, which are referred to above and include the approximately symmetric collisions 702 and the asymmetric collisions 704. Rate coefficients for exothermic reactions are high whereas the rate coefficients of the asymmetric collisions are relatively low in comparison. The rate coefficients of the approximately symmetric class of charge exchange collisions occupy a middle ground.

Some selected experimentally determined rate coefficients are $1.0 \times 10^{-9}$ cm$^3$/s for $CF_2^+ + CF_2 \rightarrow CF_2 + CF_2^+$ (a symmetric charge exchange reaction for a fluorocarbon species) which is considered a high rate coefficient and $2.5 \times 10^{-12}$ cm$^3$/s for $CF_3^+ + C_2F_6 \rightarrow CF_4 + C_2F_5^+$ (an asymmetric charge exchange reaction involving dissociation and association) which is considered a low rate coefficient. Some rate coefficients falling in the middle are $5.0 \times 10^{-10}$ cm$^3$/s for $Ar^+ + CF_2 \rightarrow Ar + CF^+ + F$ (an asymmetric charge exchange reaction involving dissociation) and $1.4 \times 10^{-10}$ cm$^3$/s for $CO^+ + O \rightarrow CO + O^+$ (an asymmetric charge exchange reaction for a carboxide species).

The interaction cross-section of a given asymmetric reaction may be increased by increasing ion energy (i.e. velocity) enough to overcome the reaction barrier. Due to the unstable nature of many radicals/ions within a plasma, the reaction barrier for most charge exchange reactions may be advantageously low allowing these reactions to be used to generate fast neutral particles from a plasma under the appropriate conditions (for plasma density, bias power frequency, bias power as discussed above, for example). A non-exhaustive list of rate coefficients for other ion-neutral charge exchange reactions can be found in Table IV of Vasenkov, et al., *Properties of c-$C_4F_8$ inductively coupled plasmas. II. Plasma chemistry and reaction mechanism for modeling of Ar/c-$C_4F_8$/$O_2$ discharges*, J. Vac. Sci. Technol., 2004, which is incorporated by reference herein along with the corresponding relevant text on pages 511-13 and 518.

FIG. 8 illustrates a cross-sectional view of an example substrate during a plasma etching process with and without differential charging in accordance with an embodiment of the invention. Similarly labeled elements may be as previously described.

Referring to FIG. 8, a cross-sectional view of a substrate 843 is shown. In a first scenario 801, an ideal etch profile is illustrated resulting from a plasma etching process utilizing positively charged ions 21 to etch a substrate material 51 using a mask material 52. The etching process creates a high aspect ratio recess 53 in the substrate material 51 with perfectly vertical sidewalls (relative to a major surface 46 of the substrate 843) and a flat bottom surface.

In a second scenario 802, an etch profile that exhibits an ion fan 54 is illustrated due to differential charging 55 in the substrate material 51 and the mask material 52 (one or both of which may be a dielectric material). When charge builds up on surfaces of the substrate 843, the positively charged ions 21 are deflected from a purely vertical path and distort the feature profile by widening the sidewalls, reducing the etch depth, and unevenly etching the bottom of the recess.

The undesirable second scenario 802 may be reduced or avoided entirely by increasing the utilization of fast neutrals directed towards and perpendicular to the major surface 46 (e.g. an exposed upper surface of the substrate 843 disposed on a lower electrode). For example, the neutrality of the fast neutral particles ensures that the substrate material 51 and the mask material 52 do not build up charge when a fast neutral flux $\Gamma_{FN}$ is applied to the substrate 843. Additionally, the fast neutral particles are immune to deflection by any charging effects that do occur at the substrate.

The verticality and energy of the fast neutrals may facilitate effective etching on par with or substantially similar to etching using vertical ions, but without the undesirable substrate charging effects. Additionally, to the extent that fast ions are needed to achieve results in a given etching process, the flux of ions required at the substrate may be advantageously reduced by supplementing the ion flux $\Gamma_i$ with a large fast neutral flux $\Gamma_{FN}$ at the substrate using the methods disclosed herein.

FIG. 9 illustrates a cross-sectional view of an example substrate during a plasma etching process with and without radical shading in accordance with an embodiment of the invention. Similarly labeled elements may be as previously described.

Referring to FIG. 9, a cross-sectional view of a substrate 943 is shown. The a first scenario 901, an ideal etch profile is illustrated with a uniform selvedge layer 56 uniformly formed on sidewalls and a bottom surface of a high aspect ratio recess 53 from interactions of neutral particles (e.g. radicals) with a substrate material 51. The uniform selvedge layer 56 may work to passivate surfaces of the substrate material 51 within the recess 53 and promote etching only by energetic particles (e.g. positively charged ions 21 accelerated by a bias voltage and/or fast neutral particles 25 with high enough energy) which further enhances the achievable aspect ratio and etch profile.

In a second scenario 902, radical shading results in an uneven application 57 of radicals in the recess 53. Cold neutral radicals without directionality are prone to shading by the features themselves, especially as the aspect ratio of the features increases. Consequently the number of cold neutral radicals that make it to the bottom of a feature may be far fewer than the number that impacts upper portions of the feature sidewalls. This uneven radical application can cause some regions of the substrate material 51 to etch slower than other regions due to passivation by the radicals. Uneven feature surfaces and feature distortions may occur as a result.

The undesirable second scenario 902 may be reduced or avoided entirely by increasing the utilization of fast neutral particles 25 directed towards and perpendicular to the major surface 46. These fast neutral particles 25 are delivered primarily to the bottom of the recess 53 because the major component of their velocity is vertical. A selvedge layer is formed at the bottom region of the recess 53 which is subsequently etched by sufficiently energetic particles. A uniform selvedge layer 56 may be advantageously created as the fast neutral particles 25 remain on the sidewalls and the bottom of the recess 53 continues to be etched. The uniform selvedge layer 56 may beneficially improve the aspect ratio and etch profile by preventing the sidewalls from being etched by particles with low energy (e.g. low velocity).

Figure 10:
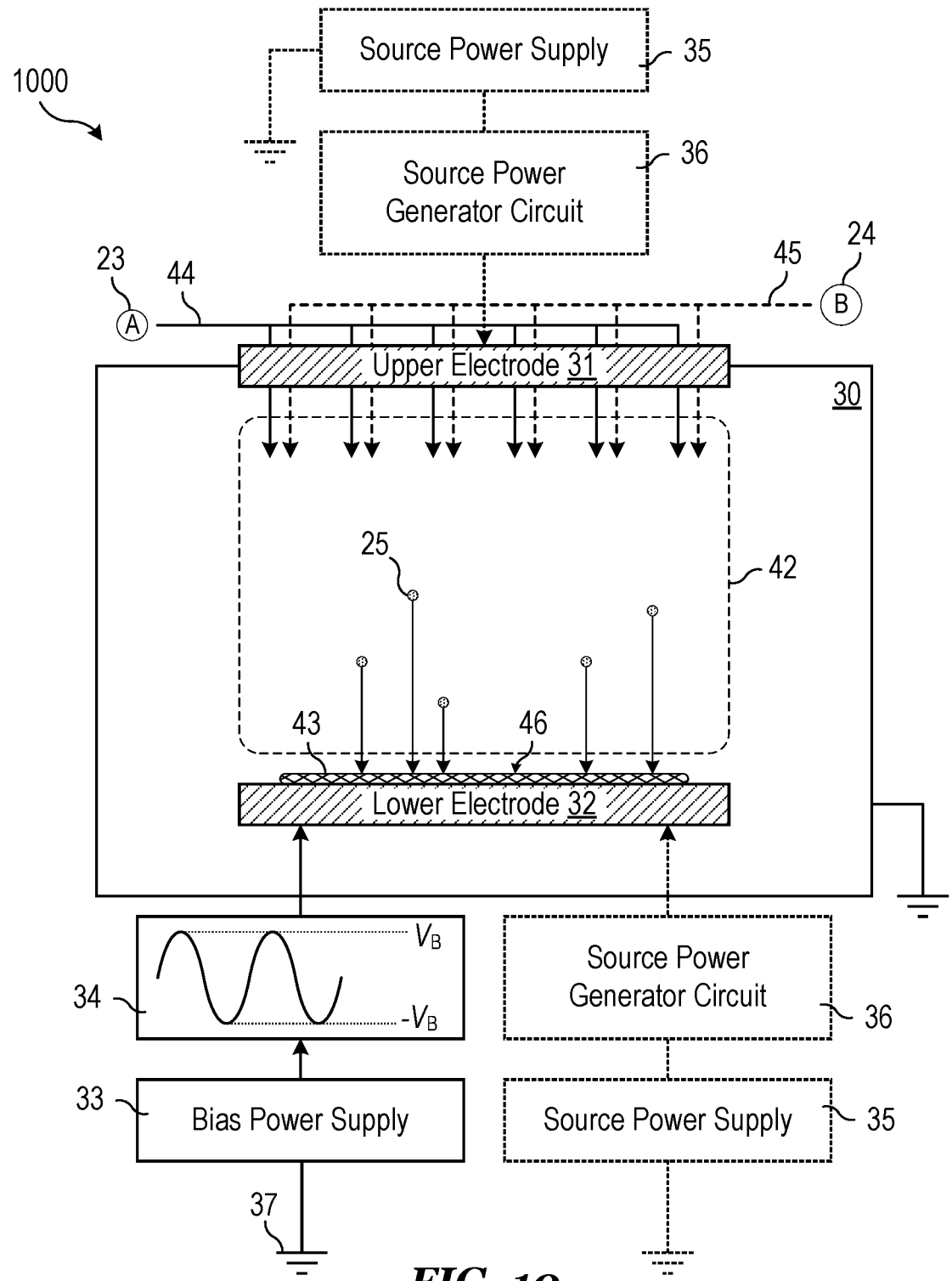
FIG. 10 illustrates a schematic diagram of an example plasma processing apparatus including a plasma processing chamber containing an electronegative plasma disposed between an upper electrode and a lower electrode in accordance with an embodiment of the invention.

FIG. 10 illustrates a schematic diagram of an example plasma processing apparatus including a plasma processing chamber containing an electronegative plasma disposed between an upper electrode and a lower electrode in accordance with an embodiment of the invention. The plasma processing apparatus of FIG. 10 may be used to perform plasma processing methods as described herein, such as the plasma processing method of FIG. 1, for example. Similarly labeled elements may be as previously described.

Referring to FIG. 10, a plasma processing apparatus 1000 includes a plasma processing chamber 30, an upper electrode 31, and a lower electrode 32. A bias power generator circuit 34 is coupled between the lower electrode 32 and a bias power supply 33. The bias power generator circuit 34 is configured to apply bias power (e.g. RF bias power pulses) to the lower electrode 32. A source power generator circuit 36 is coupled between a source power supply 35 and either the upper electrode 31 or the lower electrode 32. The bias power supply 33, the source power supply 35, and the plasma processing chamber 30 may each be coupled to ground connections 37 as shown.

The source power generator circuit 36 is configured to provide source power to the plasma processing chamber 30 (using either the upper electrode 31 or the lower electrode 32) in order to generate a glow phase of a plasma between the upper electrode 31 and the lower electrode 32 contained by the plasma processing chamber 30. The generated plasma is an electropositive plasma in one embodiment. In some embodiments the plasma is a capacitively coupled plasma, but other types of plasma may be suitable, such as inductively coupled plasma, surface wave plasma, and others. For example, a resonator such as a spiral resonator or a helical resonator may be used to generated an inductively coupled plasma while a separate upper electrode is used to apply the bias power.

A first species 23 and a second species 24 are introduced into the plasma processing chamber 30 (e.g. in a gas phase). For example the first species 23 and the second species 24 may be provided using a shower head configuration of the upper electrode 31 as shown. Other suitable configurations for introducing the first species 23 and the second species 24 into the species are also possible.

An electronegative plasma 42 is generated from the first species 23 and the second species 24 between the upper electrode 31 and the lower electrode 32. For example, applied source power may be used to generate a glow phase of an electropositive plasma that includes positive ions of the first species 23 and electrons. The electronegative plasma 42 may then be generated in an afterglow phase of the electropositive plasma by combining the electrons of the electropositive plasma with the second species 24 to form negative ions of the second species.

The bias power (e.g. the RF bias power pulses) may alternate between a positive bias voltage $V_B$ and a negative bias voltage $-V_B$ equal in magnitude to $V_B$ (e.g., no self-bias builds up at the lower electrode 32 during application of the bias power). Further, the waveform of the bias power may be sinusoidal or may also be bi-pulses, triangular pulses, or other suitable waveforms. A substrate 43 is disposed on the lower electrode 32. The substrate 43 includes a major surface 46. Fast neutral particles 25 generated from ions of the electronegative plasma that are accelerated by the application of bias power acquire an average velocity towards and substantially perpendicular to the major surface 46 of the substrate 43.

The total and relative density of the first species 23 and the second species 24 may be tuned by controlling the rate of chamber evacuation and the individual flowrates of the species. For example, the density of species in combination with the source power and the source power pulse duration may be by used to achieve a plasma density of the electronegative plasma 42 that is suitable for largescale generation of charge exchange collisions.

More species may also be provided into the plasma processing chamber 30 and may depend on the specific requirements of a given plasma process. Fast neutral particles may be generated from the electronegative plasma 42 in both symmetric and asymmetric charge exchange collisions from the first species 23, the second species 24, and from other species such as a third species different from the first species and the second species.

In various embodiments, the first species 23 is a relatively inert species such as a noble gas. In one embodiment, the first species 23 is argon (Ar). In other embodiments, the first species 23 is a compound such as a hydrocarbon, a fluorocarbon, a carboxide, and others. In one embodiment, the first species 23 is $CH_4$. In some embodiments, the second species 24 is a relatively electronegative (e.g. reactive) species such as a halogen gas. In one embodiment, the second species 24 is chlorine (Cl) which may be introduced into the plasma processing chamber 30 as a diatomic gas ($Cl_2$). In other embodiments, the second species may be an electronegative compound such as $SF_6$.

The difference in ionization energy between the first species 23 and the second species 24 may advantageously facilitate the formation of an electropositive plasma from applied source power followed by an electronegative plasma 42 after the source power is removed. For example, the second species 24 may be relatively reluctant to part with electrons (be ionized by the RF field of the source power), but be relatively eager to acquire the electrons of the electropositive plasma in the afterglow phase.

The first species 23 may also be a more reactive species (e.g. an etchant) that is ionized by the source power. For example, the first species 23 may include hydrogen, carbon, fluorine, oxygen, and others. An inert gas may also be included along with the reactive first species. In this case, the inert gas may be considered the first species while the reactive species is considered a third species with different electronegativity than the first species. Fast neutral particles may then be generated through collisions between reactive species ions and background reactive species neutrals or inert gas ions and background reactive species neutrals, for example.

Figure 11:
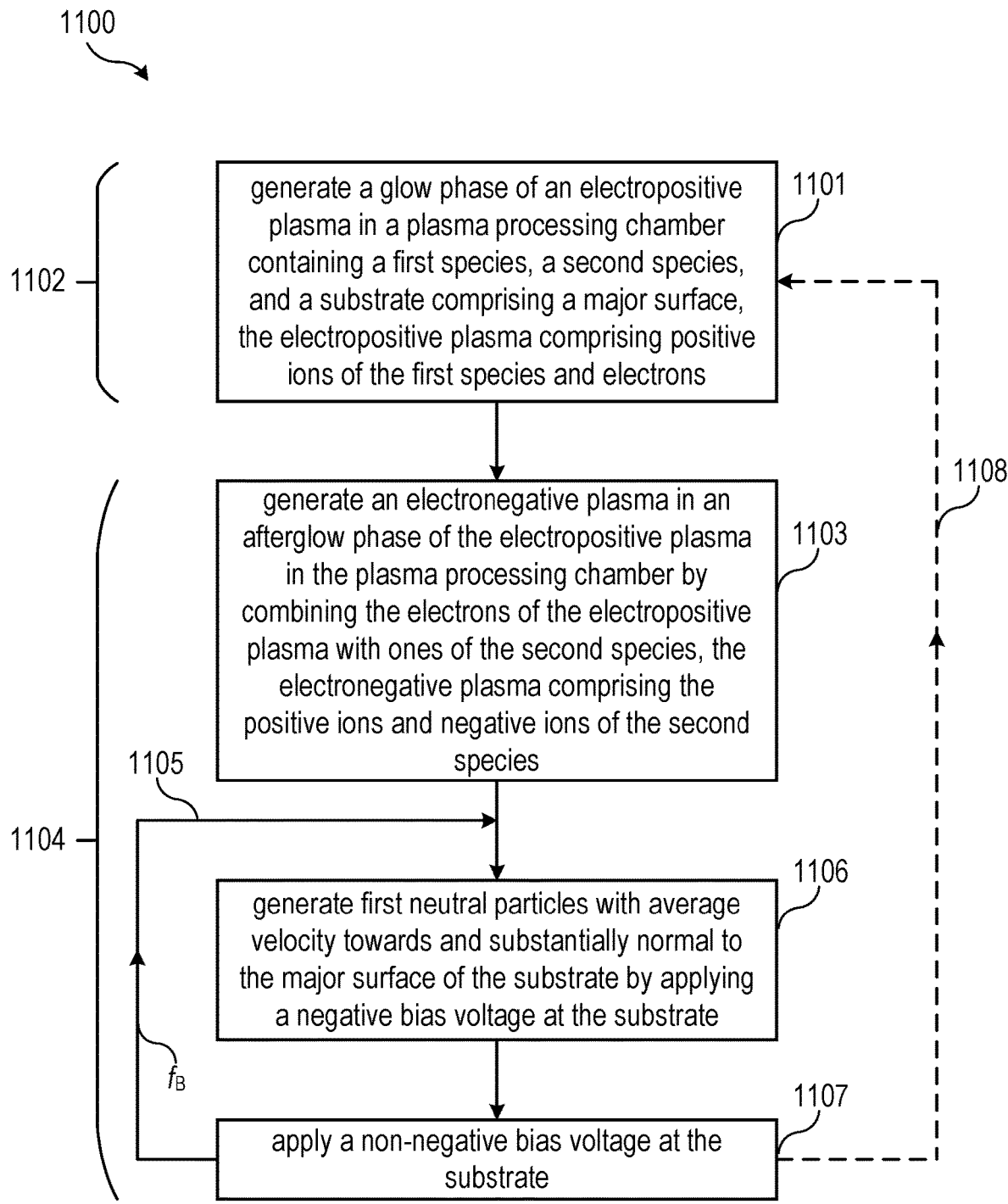
FIG. 11 illustrates an example method of plasma processing in accordance with an embodiment of the invention.

FIG. 11 illustrates an example method of plasma processing in accordance with an embodiment of the invention. The method of FIG. 11 may be combined with other methods and performed using the systems and apparatuses as described herein. For example, the method of FIG. 11 may be combined with any of the embodiments of FIGS. 1-10. Although shown in a logical order, the arrangement and numbering of the steps of FIG. 11 are not intended to be limited. The method steps of FIG. 11 may be performed in any suitable order or concurrently with one another as may be apparent to a person of skill in the art.

Referring to FIG. 11, step 1101 of a method 1100 of plasma processing is to generate a glow phase 1102 of an electropositive plasma in a plasma processing chamber containing a first species, a second species, and a substrate comprising a major surface. The electropositive plasma comprises positive ions of the first species and electrons.

Step 1103 is to generate an electronegative plasma in an afterglow phase 1104 of the electropositive plasma in the plasma processing chamber by combining the electrons of the electropositive plasma with atoms or molecules of the second species. The electronegative plasma comprises the positive ions and negative ions of the second species.

Step 1105 is to cyclically perform step 1106 and step 1107 in the afterglow phase 1104. First neutral particles with average velocity towards and substantially normal to the major surface of the substrate are generated in step 1106 by applying a negative bias voltage at the substrate. Step 1107 is to apply a non-negative bias voltage at the substrate. The method 1100 may then be optionally repeated as desired which is denoted by step 1108.

Figure 12:
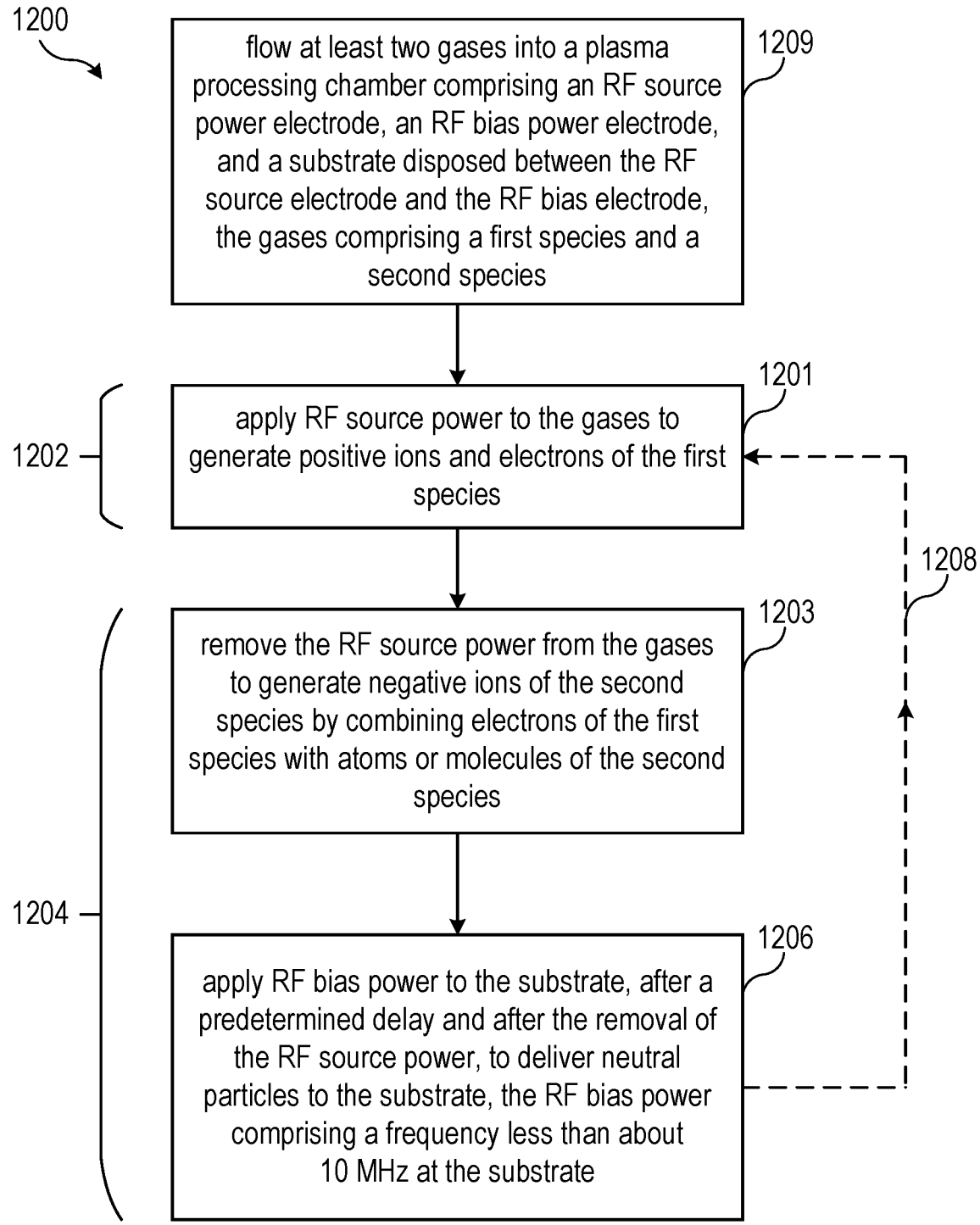
FIG. 12 illustrates another example method of plasma processing in accordance with an embodiment of the invention.

FIG. 12 illustrates an example method of plasma processing in accordance with an embodiment of the invention. The method of FIG. 12 may be combined with other methods and performed using the systems and apparatuses as described herein. For example, the method of FIG. 12 may be combined with any of the embodiments of FIGS. 1-11. Although shown in a logical order, the arrangement and numbering of the steps of FIG. 12 are not intended to be limited. The method steps of FIG. 12 may be performed in any suitable order or concurrently with one another as may be apparent to a person of skill in the art.

Referring to FIG. 12, step 1209 of a method 1200 of plasma processing is to flow at least two gases into a plasma processing chamber comprising an RF source power electrode, an RF bias power electrode, and a substrate disposed between the RF source electrode and the RF bias electrode. The gases comprise a first species and a second species. Step 1201 includes applying RF source power to the gases to generate positive ions and electrons of the first species. The application of RF source power to the gases may be considered a glow phase 1202 of the plasma.

Step 1203 is to remove the RF source power from the gases to generate negative ions of the second species by combining electrons of the first species with atoms or molecules of the second species. For example, the atoms of molecules of the second species may be neutral electronegative species which combine with electrons as the electron temperature drops. RF bias power is applied to the substrate in step 1206 after a predetermined delay and after the removal of the RF source power to deliver neutral particles to the substrate. The RF bias power comprises a frequency less than about 10 MHz at the substrate. Step 1203 and step 1206 may be considered an afterglow phase 1204 of the plasma. While the gases remain or are flowed into the plasma processing chamber, step 1201, step 1203, and step 1206, (e.g. the glow phase 1202 and the afterglow phase 1204) may then be optionally repeated as desired which is indicated by step 1208.

Example embodiments of the invention are summarized here. Other embodiments can also be understood from the entirety of the specification as well as the claims filed herein.

Example 1. A method of plasma processing including: generating a glow phase of an electropositive plasma in a plasma processing chamber containing a first species, a second species, and a substrate including a major surface, the electropositive plasma including positive ions of the first species and electrons; generating an electronegative plasma in an afterglow phase of the electropositive plasma in the plasma processing chamber by combining the electrons of the electropositive plasma with atoms or molecules of the second species, the electronegative plasma including the positive ions, and negative ions of the second species; and in the afterglow phase, cyclically performing steps of generating first neutral particles with average velocity towards and substantially normal to the major surface of the substrate by applying a negative bias voltage at the substrate, and applying a non-negative bias voltage at the substrate.

Example 2. The method of example 1, wherein generating the first neutral particles includes: accelerating the positive ions towards the substrate to promote charge exchange collisions within the electronegative plasma that generate the first neutral particles having the average velocity.

Example 3. The method of example 2, wherein the charge exchange collisions within the electronegative plasma include collisions between ones of the positive ions and neutral background particles of the first species.

Example 4. The method of example 2, wherein the charge exchange collisions within the electronegative plasma include collisions between ones of the positive ions and neutral background particles of a third species including a different electronegativity than the first species.

Example 5. The method of one of examples 1 to 4, wherein applying the non-negative bias voltage at the substrate includes: generating second neutral particles with average velocity towards and substantially normal to the major surface of the substrate by applying a positive bias voltage at the substrate.

Example 6. The method of one of examples 1 to 5, wherein the second species is chlorine.

Example 7. The method of example 6, wherein the first species is argon.

Example 8. The method of example 6, wherein the first species includes hydrogen and carbon.

Example 9. A method of plasma processing including: flowing at least two gases into a plasma processing chamber including a radio frequency (RF) source power electrode, an RF bias power electrode, and a substrate disposed between the RF source electrode and the RF bias electrode, the gases including a first species and a second species; applying RF source power to the gases to generate positive ions and electrons of the first species; removing the RF source power from the gases to generate negative ions of the second species by combining electrons of the first species with atoms or molecules of the second species; and applying RF bias power to the substrate, after a predetermined delay and after the removal of the RF source power, to deliver neutral particles to the substrate, the RF bias power including a frequency less than about 10 MHz at the substrate.

Example 10. The method of example 9, wherein the frequency is between about 1 MHz and about 10 MHz.

Example 11. The method of one of examples 9 and 10, wherein no self-bias is generated at the substrate while applying the RF bias power, the RF bias power alternating between generating, at the substrate, a positive voltage and a negative voltage equal in magnitude to the positive voltage.

Example 12. The method of one of examples 9 to 11, wherein the absolute value of the peak voltage of the RF bias power is less than about 500 V.

Example 13. The method of one of examples 9 to 12, wherein a plasma density in the plasma processing chamber is less than about $1 \times 10^{17}$ m$^{-3}$ for the duration of the application of the RF bias power.

Example 14. The method of one of examples 9 to 13, further including: cyclically performing the steps of applying and removing the RF source power followed by applying RF bias power in the plasma processing chamber after the predetermined delay.

Example 15. A plasma processing apparatus including: a plasma processing chamber configured to contain an electronegative plasma including positive ions of a first species and negative ions of a second species; a source power supply coupled to the plasma processing chamber and configured to generate an electropositive plasma in the plasma processing chamber, the electropositive plasma including the positive ions of the first species and electrons that combine with the second species to form the negative ions; a substrate chuck including a major surface disposed in the plasma processing chamber; and a bias power generator circuit coupled between the substrate and a bias power supply, the bias power generator circuit being configured to apply a radio frequency (RF) bias voltage at the substrate, wherein the RF bias voltage alternates between a negative voltage and a non-negative voltage, and the negative voltage generates first neutral particles with velocity vectors pointing in the direction of and substantially normal to the major surface of the substrate.

Example 16. The plasma processing apparatus of example 15, wherein the bias power generator circuit is configured to apply the RF bias voltage at a frequency between about 1 MHz and about 10 MHz.

Example 17. The plasma processing apparatus of one of examples 15 and 16, further including: an upper electrode coupled to the plasma processing chamber and configured to be held at a ground voltage during application of the RF bias voltage; and a lower electrode coupled to the substrate and the bias power generator circuit, the lower electrode being configured to apply the RF bias voltage at the substrate.

Example 18. The plasma processing apparatus of example 17, further including: a source power generator circuit coupled between the plasma processing chamber and the source power supply, the source power generator circuit being configured to apply high frequency RF source power to the upper electrode to generate the electropositive plasma, wherein the electropositive plasma is a capacitively coupled plasma.

Example 19. The plasma processing apparatus of example 18, wherein the source power generator circuit is coupled to the upper electrode or the lower electrode.

Example 20. The plasma processing chamber of one of examples 17 to 19, wherein the upper electrode and the lower electrode are separated by a distance less than about 15 cm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing comprising:
generating a glow phase of an electropositive plasma in a plasma processing chamber containing a first species, a second species, and a substrate comprising a major surface, the electropositive plasma comprising positive ions of the first species and electrons;
generating an electronegative plasma in an afterglow phase of the electropositive plasma in the plasma processing chamber by combining the electrons of the electropositive plasma with atoms or molecules of the second species, the electronegative plasma comprising the positive ions, and negative ions of the second species; and
in the afterglow phase, cyclically performing steps of
generating first neutral particles with average velocity towards and substantially normal to the major surface of the substrate by applying a negative bias voltage at the substrate, and
applying a non-negative bias voltage at the substrate.

2. The method of claim 1, wherein applying the non-negative bias voltage at the substrate comprises:
generating second neutral particles with average velocity towards and substantially normal to the major surface of the substrate by applying a positive bias voltage at the substrate.

3. The method of claim 1, wherein generating the first neutral particles comprises:
accelerating the positive ions towards the substrate to promote charge exchange collisions within the electronegative plasma that generate the first neutral particles having the average velocity.

4. The method of claim 3, wherein the charge exchange collisions within the electronegative plasma comprise collisions between ones of the positive ions and neutral background particles of the first species.

5. The method of claim 3, wherein the charge exchange collisions within the electronegative plasma comprise collisions between ones of the positive ions and neutral background particles of a third species comprising a different electronegativity than the first species.

6. The method of claim 1, wherein the second species is chlorine.

7. The method of claim 6, wherein the first species is argon.

8. The method of claim 6, wherein the first species comprises hydrogen and carbon.

9. A method of plasma processing comprising:
flowing at least two gases into a plasma processing chamber comprising a radio frequency (RF) source power electrode, an RF bias power electrode, and a substrate disposed between the RF source electrode and the RF bias electrode, the gases comprising a first species and a second species;
applying RF source power to the gases to generate positive ions and electrons of the first species in an unobstructed region of the plasma processing chamber having unobstructed fluid communication with the substrate;
removing the RF source power from the gases to generate negative ions of the second species in the unobstructed region by combining the electrons of the first species with atoms or molecules of the second species; and
applying RF bias power to the substrate, after a predetermined delay and after the removal of the RF source power, to deliver neutral particles directly from the unobstructed region to the substrate, the RF bias power comprising a frequency less than about 10 MHz at the substrate.

10. The method of claim 9, wherein the frequency is greater than about 1 MHz and less than about 10 MHz.

11. The method of claim 9, wherein no self-bias is generated at the substrate while applying the RF bias power, the RF bias power alternating between generating, at the substrate, a positive voltage and a negative voltage equal in magnitude to the positive voltage.

12. The method of claim 9, wherein the absolute value of the peak voltage of the RF bias power is less than about 500 V.

13. The method of claim 9, wherein a plasma density in the plasma processing chamber is less than about $1 \times 10^{17}$ m$^{-3}$ for the duration of the application of the RF bias power.

14. The method of claim 9, further comprising:
cyclically performing the steps of applying and removing the RF source power followed by applying RF bias power in the plasma processing chamber after the predetermined delay.

15. A method of plasma processing comprising cyclically performing:
applying radio frequency (RF) source power to a source electrode in a plasma processing chamber containing a substrate and gases comprising a first species and a second species to form a plasma comprising positive ions of the first species, neutral species of the second species, and electrons;
removing the RF source power from the source electrode for a predetermined duration to form negative ions of the second species; and
applying RF bias power to a lower electrode supporting the substrate after the predetermined duration to deliver neutral particles of the first species and the second species to the substrate, the RF bias power oscillating between a positive voltage and a negative voltage relative to a reference potential at a frequency greater than about 1 MHz and less than about 10 MHz.

16. The method of claim 15,
wherein the lower electrode is the source electrode,
wherein the plasma is formed between the substrate and an upper electrode while the upper electrode is at the reference potential, and
wherein applying the RF bias power comprises applying the RF bias power to the lower electrode while the upper electrode is at the reference potential.

17. The method of claim 15,
wherein the source electrode is an upper electrode,
wherein the plasma is formed between the substrate and the upper electrode while the lower electrode is at the reference potential, and
wherein applying the RF bias power comprises applying the RF bias power to the lower electrode while the upper electrode is at the reference potential.

18. The method of claim 15, wherein the first species is a noble gas and the second species is a halogen gas.

19. The method of claim 15, wherein the plasma is formed between the substrate and an upper electrode, and wherein the distance between the lower electrode and the upper electrode is about 15 cm or less.

20. The method of claim 15, wherein the absolute value of the peak voltage of the RF bias power is less than about 500 V.

* * * * *